June 14, 1960 A. G. POKRANT 2,941,046

AUTOMATIC GAIN CONTROL CIRCUIT

Filed Jan. 27, 1958

United States Patent Office 2,941,046 Patented June 14, 1960

2,941,046

AUTOMATIC GAIN CONTROL CIRCUIT

Adolph G. Pokrant, Forest Hills, Pa., assignor to Westinghouse Air Brake Company, Wilmerding, Pa., a corporation of Pennsylvania Filed Jan. 27, 1958, Ser. No. 711,440

5 Claims. (Cl. 330—22)

My invention relates to transistor signal circuit, and more particularly to a transistor circuit for providing automatic gain control.

It is a principal object of my invention to provide an improved automatic gain control circuit.

It is another object of my invention to provide an automatic gain control circuit suitable for use in connection with signals which range from small to very large signals.

In the attainment of the foregoing objects I provide an automatic gain control circuit comprising at least two amplifying stages in which control of the output signal amplitude is provided by a combination of effects. The stages are transformer coupled and each of the stages desirably comprises a transistor of the three electrode type. A voltage feedback loop is provided from the last stage to the preceding stage. Rectifiers are included in the input portions of the last two stages and provide a change in effective impedance with changes in the amplitude of the signal applied to the transistors. The rectifiers also provide a change in the bias of the transistors dependent on the input signal level to change the class of operation of the transistors. Saturation of one or more of the stages is obtained when the input signal level is abnormally high. The preceding effects are combined in my circuit to provide an excellent automatic gain control.

Figure 1:
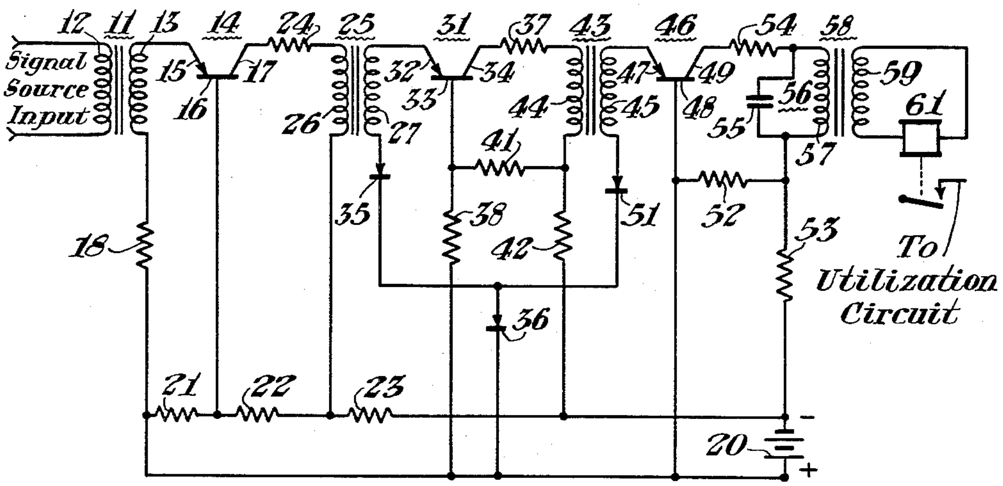
Figures 2A, 2B:
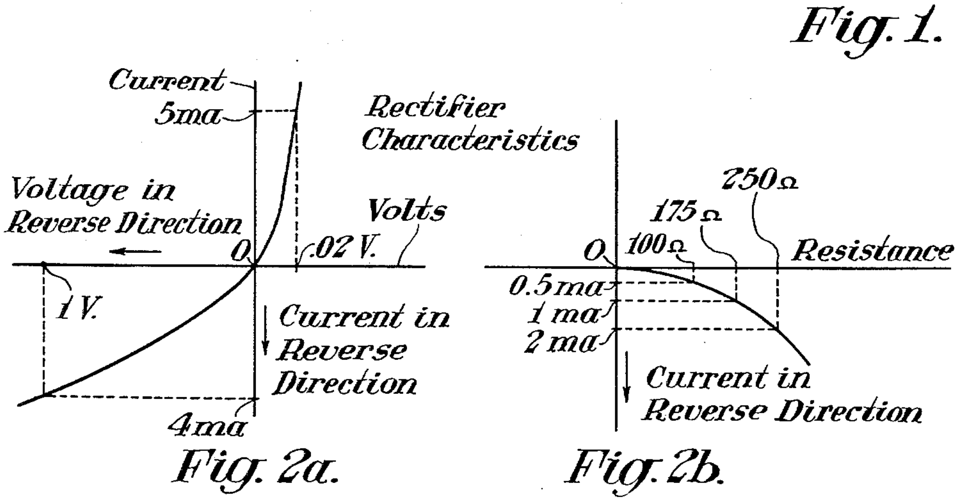

Other objects and advantages of my invention will become apparent from the following description and the accompanying drawings in which:

Fig. 1 is a schematic diagram of the automatic gain control circuit in accordance with my invention; and Figs. 2*a* and 2*b* are useful in discussing the operation of the circuit of Fig. 1.

I shall first describe my automatic gain control circuit and shall then point out the novel features thereof in the appended claims.

Referring to Fig. 1, the input signal source is coupled through transformer 11 having a primary winding 12 and secondary winding 13 to a P–N–P type transistor 14 consisting of emitter electrode 15, a base electrode 16 and a collector electrode 17. One terminal of secondary winding 13 is connected directly to the emitter 15, and the other terminal thereof is connected through a resistance 18 to the positive terminal of a source of potential 20. Base electrode **1*b* is connected to the junction point of resistances 21 and 22. The opposite terminal of resistance 21 is connected to the positive terminal of source 20 and the opposite terminal of resistance 22 is connected through a resistance 23 to the negative terminal of source 20. Collector 17 is connected through a current limiting resistance 24, and primary winding 26 of a transformer 25 to the junction of resistances 22 and 23. The output from transistor 14 is coupled by primary and secondary windings 26 and 27 of transformer 25 to a second amplifying stage consisting of transistor 31**.

Transistor 31 includes an emitter electrode 32, a base electrode 33 and a collector electrode 34. One terminal of secondary winding 27 is connected to emitter 32 and the other terminal thereof is connected through rectifiers 35 and 36 in series to the positive terminal of source 20. Rectifiers 35 and 36 are reverse connected such as to tend to oppose current flow in the emitter 32 circuit. Base electrode 33 is connected through resistance 38 to the positive terminal of source 20. Collector 34 is connected through a current limiting resistance 37, primary winding 44 of transformer 43, and resistance 42 to the negative terminal of source 20. A bleeder or voltage divider resistance 41 is connected from the base 33 to the lower terminal of primary winding 44. The output from transistor 31 is inductively coupled by primary and secondary windings 44 and 45 of transformer 43 to a third amplifying stage consisting of transistor 46.

Transistor 46 consists of an emitter electrode 47, a base electrode 48 and a collector electrode 49. One terminal of secondary winding 45 is connected to emitter 47 and the other terminal thereof is connected through a rectifier 51 to the junction point of rectifiers 35 and 36. Rectifiers 51 and 36 which form a part of the emitter 47 circuit are reverse connected such as to tend to oppose current flow in said emitter circuit. The base electrode 48 of transistor 46 is connected directly to the positive terminal of source 20. Collector 49 connects through a current limiting resistance 54 to one terminal of a parallel tuned circuit 56 consisting of a condenser 55 and the primary winding 57 of an output transformer 58. The other terminal of the tuned circuit 56 is connected through resistance 53 to the negative terminal of source 20. A bleeder resistance 52 is connected from base 48 to the lower terminal of the tuned circuit 56. The secondary winding 59 of theoutput transformer 58 is connected to a device such as a relay 61 to actuate desired external circuitry.

Transistor 14 is biased to operate as a class A amplifier and transistors 31 and 46 are biased to operate as class B amplifiers. In one practical embodiment a pulsed carrier wave is to be processed and transistor 14 is included in the circuit to serve as a limiter when the input signal amplitude reaches a predetermined high level. Thus after a predetermined maximum signal is applied across transformer 11, transistor 14 will saturate and clip or limit any higher values of applied signals.

A small amount of current normally flows in the emitter 47 circuit of transistor 46 which circuit consists of reverse connected rectifiers 36 and 51, secondary winding 45 of transformer 43 and emitter 47 to base 48. The reverse impedance of the rectifiers increases with an increase in the current flowing therethrough, see Fig. 2*b*. With a no-signal or small signal input the impedance across rectifiers 36 and 51 will be relatively low and a large part of the signal voltage drop will occur across the emitter 47 to base 48 electrodes. A larger signal causes an increase in the current flowing in the emitter 47 circuit which in turn will cause an increased voltage drop across rectifier 36, see Fig. 2*a*. As noted before and as can be seen from Fig. 1, rectifier 36 also forms a part of the emitter 32 current path for transistor 31. The voltage drop across rectifier 36 biases emitter 32 somewhat higher than desired and transistor 31 would tend to operate as a class C amplifier. A certain minimum signal would then have to be applied to the circuit before transistor 31 could function as an amplifier. A bias sufficient in value to counteract this effect to assure transistor 31 is biased for class B operation and developed across resistance 38. The current flow through resistance 38 is sufficient to lower the emitter 32 to base 33 bias, and even under small signal conditions transistor 31 operates as a class B amplifier.

As is known, it is a characteristic of class B amplifiers that as the signal level increases the current in the amplifiers also increases. As noted above an increase in current through the emitter 32 circuit causes the impedance through reverse connected rectifiers 36 and 35 to increase substantially, while an increase in current through the emitter 47 circuit causes the impedance through rectifiers 36 and 51 to increase, see Fig. 2b. In effect rectifiers 35, 36 and 51 function as variable resistances dependent on the amount of current flowing therethrough.

The increase in the reverse impedance through rectifiers 35, 36 and 51 due to increased current has two effects, first, transistors 31 and 46 are biased into class C operation, and second, the total impedance in the emitter circuit of each transistor is increased. An increase in the effective resistance of rectifiers 35 and 36 causes that portion of the effective load which transistor 31 itself reflects back, through secondary winding 27, to primary winding 26 to be less at high levels of signal input than at the lower levels of signal inputs. Likewise, an increase in resistance of rectifiers 36 and 51 causes the proportion of the input voltage applied to transistor 46 to decrease. Thus, for example, although at high signal levels the voltage across transistor 46 will increase, the percentage of increase will be less than the percentage increase in the voltage developed across rectifiers 36 and 51. As a result, the signal input to transistors 31 and 46 is controlled in inverse relation to the input signal level. Rectifiers 35, 36 and 51, however, do reach a maximum value of resistance at from 5 to 10 milliamperes of reverse current flow through said rectifiers. At higher signal levels, the major part of the signal limiting is provided by a change in bias, by a degenerative feedback, and by saturation of the transistors.

The change in bias of transistors 31 and 46 due to the increased impedance of rectifiers 35, 36 and 51 which impedance is in turn proportional to the increased signal level also provides automatic gain control action. Further, a degenerative voltage proportional to the signal level is fed back to transistor 31. It will be seen that the voltage developed across rectifier 36 due to current flow in the emitter 47 circuit of transistor 46 will in fact be impressed on the emitter 32 circuit of transistor 31. The voltage across rectifier 36 will tend to reduce the current flow through transistor 31 since a larger or higher signal will be needed to drive transistor 31. This voltage that is fed back will increase as the resistance of rectifier 36 increases. In addition transistors 31 and 46 are driven into saturation which, as is known, has the effect of preventing any further signal amplification. Resistances 37 and 54 in collector circuits 34 and 49 limit the current flowing through transistors 31 and 46 to a level which can be tolerated by said transistors and prevent breakdown thereof.

The circuit is operable using impedances in the form of variable resistors (varistors) or in the form of fixed resistors in place of rectifiers 35, 36 and 51. However, AGC operation at smaller signal levels was desired, and it was found that a very satisfactory circuit for this purpose was obtained using rectifiers. By using rectifiers having reverse impedances proportional to the input signal level, the range of operation was extended by approximately 18 db toward the direction of smaller signal inputs.

Although the circuit as shown employs common base circuits, the same operating principles would apply for example with common emitter circuits with suitable bias arrangements as are well known in the art. Further, where necessary, tuned circuits may be added to reduce any possible distortion introduced by large input signal amplitudes.

While my invention has been described with reference to a particular embodiment thereof, it will be understood that various modifications may be made by those skilled in the art without departing from the invention. The appended claims are therefore intended to cover all such modifications within the true spirit and scope of the invention.

Having thus described my invention, what I claim is:

1. An automatic gain control circuit comprising first and second transistors connected in cascade and each having input and output portions, means connecting a signal voltage to the input portion of said first transistor, first, second and third rectifiers each having a low forward impedance and a high reverse impedance which reverse impedance increases with an increase in reverse current flowing therethrough, means connecting said rectifiers to a common junction, means connecting said first and second rectifiers to the input portion of said first transistor to present a high reverse impedance to current flow through said first transistor, said first and third rectifiers being connected to the input portion of said second transistor to present a high reverse impedance to current flow through said second transistor, each of said transistors and the rectifiers connected respectively thereto effecting a division of the signal voltage impressed thereacross to vary the percentage of the signal voltage developed across each of said transistors inversely with any variation in said signal voltage.

2. An automatic gain control circuit comprising first and second transistors each having input and output portions, means connecting an operating potential to said transistors, means inductively coupling a signal voltage to the input portion of said first transistor, the output portion of said first transistor being inductively coupled to the input portion of said second transistor, first, second and third rectifying elements each having a low forward impedance and a high reverse impedance which reverse impedance increases with an increase in reverse current flowing therethrough, means connecting said rectifying elements to a common junction, said first and second rectifying elements being connected to the input portion of said first transistor to present a high reverse impedance to current flowing through said first transistor, said first and said third rectifying elements being connected to the input portion of said second transistor to present a high reverse impedance to current flow through said second transistor whereby said rectifiers develop a voltage thereacross which varies with the signal voltage to bias said transistors to oppose changes in current flow therethrough.

3. An automatic gain control circuit comprising first and second transistors each having emitter, base and collector electrodes, means connecting an operating potential to said transistors, transformer means inductively coupling a signal voltage to the emitter of said first transistor, transformer means inductively coupling the collector of said first transistor to the emitter of said second transistor, first, second and third rectifying elements each having a low forward impedance and a high reverse impedance which reverse impedance increases with an increase in reverse current flowing therethrough, means connecting said rectifying elements to a common junction, said first and second rectifying elements being connected in series with the emitter of said first transistor to present a high reverse impedance to current flowing through said first transistor, said first and said third rectifying elements being connected in series with the emitter of said second transistor to present a high reverse impedance to current flow through said second transistor whereby said rectifiers develop a voltage thereacross which varies with the signal voltage to bias the transistors connected in series therewith to oppose changes in current flow therethrough.

4. An automatic gain control circuit comprising a pair of cascade coupled transistors each having input and output portions, means coupling a signal voltage to the input portion of the first of said transistors, first, second and third rectifiers each having a low forward impedance and a high reverse impedance which increases with an increase in reverse current flowing therethrough, means connecting said rectifiers to a common junction, means connecting said first and second rectifiers to the input portion of said first transistor to present a high reverse impedance to current flow through said first transistor, means connecting said first and third rectifiers to the input portion of the second of said transistors to present a high reverse impedance to current flow through said second transistor, the input portion of said first transistor and said first and second rectifiers effecting a division of the signal voltage impressed thereacross to vary the percentage of the signal voltage developed across said first transistor inversely with any variation in said input signal voltage, the input portion of said second transistor and said first and third rectifiers effecting a division of the signal voltage coupled from said first transistor to said second transistor to vary the percentage of the signal voltage developed across said second transistor inversely with any variation in signal voltage coupled thereto, and said common junction connecting the voltage developed across said first rectifier due to current flow in said second transistor as a feedback voltage to said first transistor.

5. An automatic gain control circuit comprising first and second transistors each having emitter, base and collector electrodes, means connecting an operating potential to said electrodes, transformer means coupling a signal voltage to the emitter of said first transistor, transformer means coupling signal voltage from the collector of said first transistor to the emitter of said second transistor, first, second and third rectifiers each having a low forward impedance and a high reverse impedance which reverse impedance increases with an increase in reverse current flowing therethrough, means connecting said rectifiers to a common junction, means connecting said first and second rectifiers in series with the emitter of said first transistor to present a high reverse impedance to current flow through said first transistor, means connecting said first and third rectifiers in series with the emitter of said second transistor to present a high reverse impedance to current flow through said second transistor, the emitter to base path of said first transistor, and said first and second rectifiers effecting a division of the signal voltage impressed thereacross to vary the percentage of the signal voltage developed across said first transistor inversely with any variation in said signal voltage, the emitter to base path of said second transistor and said first and third rectifiers effecting a division of the signal voltage coupled from said first transistor to said second transistor to vary the percentage of the signal voltage developed across said second transistor inversely with any variation in signal voltage coupled thereto, and said common junction connecting the voltage developed across said first rectifier due to current flow in said second transistor as an inverse feedback voltage to said first transistor.

References Cited in the file of this patent

UNITED STATES PATENTS 2,833,870 Wilhelmsen ————— May 6, 1958